(12) United States Patent
Morikado et al.

(10) Patent No.: US 7,583,538 B2
(45) Date of Patent: Sep. 1, 2009

(54) SEMICONDUCTOR MEMORY AND READ METHOD OF THE SAME

(75) Inventors: Mutsuo Morikado, Yokohama (JP); Tomoki Higashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 186 days.

(21) Appl. No.: 11/691,043

(22) Filed: Mar. 26, 2007

(65) Prior Publication Data
US 2007/0242526 A1    Oct. 18, 2007

(30) Foreign Application Priority Data
Apr. 18, 2006   (JP)   ............................. 2006-114421

(51) Int. Cl.
*G11C 11/03*  (2006.01)
(52) U.S. Cl. ............................. 365/185.26; 365/185.27; 365/226; 365/227; 365/229
(58) Field of Classification Search ............ 365/185.18, 365/185.26, 185.27, 185.14, 226, 227, 229
See application file for complete search history.

(56) References Cited

U.S. PATENT DOCUMENTS 6,621,725 B2 * 9/2003 Ohsawa ........................ 365/150
7,257,015 B2 * 8/2007 Ohsawa et al. ............... 365/150

FOREIGN PATENT DOCUMENTS

| JP | 62-7149 | 1/1987 |
|---|---|---|
| JP | 2002-246571 | 8/2002 |
| JP | 2002-260381 | 9/2002 |

* cited by examiner

*Primary Examiner*—Pho M. Luu
(74) *Attorney, Agent, or Firm*—Oblon, Spivak, McClelland, Maier & Neustadt, P.C.

(57) ABSTRACT

A semiconductor memory including a memory cell which is a MOSFET formed on an SOI substrate. The memory cell has a gate electrode connected to a word line, a drain region connected to a bit line, and a grounded source region. An operation of reading out data written in the memory cell is performed under a biasing condition by which a relationship $Vd > Vg - Vth0$ holds between a gate voltage Vg to be applied to said gate electrode, a drain voltage Vd to be applied to said drain region, a threshold voltage Vth1 of said MOSFET when a predetermined amount of holes are stored in a body region of the memory cell, and a threshold voltage Vth0 of said MOSFET when holes whose amount is smaller than the predetermined amount are stored in the body region.

17 Claims, 10 Drawing Sheets

SEMICONDUCTOR MEMORY AND READ METHOD OF THE SAME

CROSS REFERENCE TO RELATED APPLICATION

This application is based upon and claims benefit of priority under 35 USC §119 from the Japanese Patent Application No. 2006-114421, filed on Apr. 18, 2006, the entire contents of which are incorporated herein by reference.

BACKGROUND OF THE INVENTION

The present invention relates to a semiconductor memory and a read method of the same and, more particularly, to an FBC (Floating Body Cell) memory formed on an SOI (Silicon On Insulator) substrate and a read method of the same.

(1) Structure of FBC Memory

The FBC memory is an n-type MOSFET formed on an SOI substrate. An outline of the structure of the FBC memory will be described below. A memory cell has the four types of electrodes described below:

1) Word line: A word line is driven to select a memory cell in read and write operations, and corresponds to the gate electrode of a MOSFET of the memory cell. A gate voltage Vg is applied to the word line.

2) Bit line: A bit line applies an appropriate bias voltage to the memory cell in read and write operations, and is used to input and output data. The bit line corresponds to the drain electrode of the MOSFET of the memory cell. A drain voltage Vd is applied to the bit line.

3) Source line: A source line corresponds to the source electrode of the MOSFET of the memory cell. A ground voltage VSS is applied to the source line.

4) Plate line: A plate line is an electrode formed on the lower surface of a box oxide film of the SOI substrate. This electrode is a counterelectrode of a body region in a floating state of the MOSFET of the memory cell.

(2) Operation of FBC Memory

The operation of the FBC memory having the above structure will be explained below.

1) Write of Data "1"

The n-type MOSFET of the memory cell is operated in a saturation region by biasing the cell to drain voltage Vd=2 V and gate voltage Vg=1.5 V. Consequently, an impact ionization phenomenon occurs at the drain end of the memory cell to generate hot carriers. The body region of the memory cell stores the generated holes. When the body region thus stores the holes, the body effect makes the threshold voltage (letting Vth1 be the threshold voltage when data "1" is held in the memory cell) of the MOSFET lower than a normal threshold voltage.

Note that in a bulk MOSFET, holes generated by the impact ionization phenomenon are absorbed from the substrate via well contacts and hence are not stored in a memory cell, unlike in the memory cell of the FBC memory.

2) Write of Data "0"

The p-n junction at the drain end of the memory cell is biased in the forward direction by biasing the cell to drain voltage Vd=−1.5 V and gate voltage Vg=1.5 V. Since this draws the holes stored in the body region to the drain side, the potential of the boy region deepens, so the threshold voltage (letting Vth0 be the threshold voltage when data "0" is held in the memory cell) rises.

3) Data Read

The memory cell is operated in a linear region by biasing it to drain voltage Vd=0.2 V and gate voltage Vg=1.5 V. The difference between the potentials of the body region resulting from the difference between written data is read out as a difference between the threshold voltages Vth1 and Vth0. The foregoing are the biasing conditions of the operation of the FBC memory cell.

(3) Characteristics of FBC Memory

The FBC memory performs a data read operation in the linear region. Therefore, it is conventionally assumed that a signal in the body region does not deteriorate. In practice, however, carriers stored in the body region reduce owing to a phenomenon called charge pumping.

This phenomenon is that if a word line of a memory cell in which holes are stored in the body region because data "1" is written is accessed a plurality of number of times, the holes are trapped by the interface state of the interface between a silicon oxide film and silicon substrate, and the data "1" changes to data "0". This phenomenon makes the FBC memory require a restore operation.

The problem of the linear operation of the MOSFET as the FBC memory cell will be described below.

A drain current Id of the MOSFET operating in the linear region is given by $$Id = K(Vg - Vth - \tfrac{1}{2} \times Vd) \times Vd \quad (1)$$

On the other hand, the drain current Id of the MOSFET operating in the saturation region is given by $$Id = K(Vg - Vth)^2 \quad (2)$$

where K is an amount depending on the basic parameters (e.g., the gate length, gate width, and gate oxide film thickness) of the device.

As is obvious from a comparison of equation (1) with equation (2), the drain current Id is independent of the drain voltage Vd in the saturation region operation, and depends upon the drain voltage Vd in the linear region operation.

When the drain current Id depends upon the drain voltage Vd, the parasitic resistance (channel resistance Rch+drain resistance Rd+source resistance Rs) of the MOSFET increases the variation in drain current Id. This is so because in the linear region operation, the drain current Id is readily influenced by the parasitic resistance (drain resistance Rd+source resistance Rs) except for the channel resistance Rch.

On the other hand, in the saturation region operation, the drain current Id is independent of the drain voltage Vd, so the ratio of the channel resistance Rch in the total parasitic resistance increases.

Data read from the memory cell of the FBC memory is performed by reading out the potential difference in the body region as the difference between the threshold voltages Vth1 and Vth0. In practice, however, the threshold voltages Vth1 and Vth0 cannot be directly read out. Therefore, the drain current Id corresponding to each threshold voltage is read out.

In the conventional FBC memory as described above, the potential difference in the body region is read out as the difference between the drain currents Id in the linear region operation. Since this superposes the variation in parasitic resistance on the variation in drain current Id, an operation error occurs during data read and decreases the yield.

A reference concerning the conventional FBC memory is: Japanese Patent Laid-Open No. 2002-246571

SUMMARY OF THE INVENTION

According to one aspect of the present invention, there is provided a semiconductor memory comprising a memory cell which is a MOSFET formed on an SOI substrate and having a gate electrode connected to a word line, a drain region connected to a bit line, and a grounded source region, wherein an operation of reading out data written in said memory cell is performed under a biasing condition by which a relationship $Vd>Vg-Vth0$ holds between a gate voltage $Vg$ to be applied to said gate electrode, a drain voltage $Vd$ to be applied to said drain region, a threshold voltage $Vth1$ of said MOSFET when a predetermined amount of holes are stored in a body region of said memory cell, and a threshold voltage $Vth0$ of said MOSFET when holes whose amount is smaller than the predetermined amount are stored in said body region.

According to one aspect of the present invention, there is provided a read method of a semiconductor memory comprising a memory cell which is a MOSFET formed on an SOI substrate and having a gate electrode connected to a word line, a drain region connected to a bit line, and a grounded source region, wherein an operation of reading out data written in said memory cell is performed under a biasing condition by which a relationship $Vd>Vg-Vth0$ holds between a gate voltage $Vg$ to be applied to said gate electrode, a drain voltage $Vd$ to be applied to said drain region, a threshold voltage $Vth1$ of said MOSFET when a predetermined amount of holes are stored in a body region of said memory cell, and a threshold voltage $Vth0$ of said MOSFET when holes whose amount is smaller than the predetermined amount are stored in said body region.

DETAILED DESCRIPTION OF THE INVENTION

Embodiments of the present invention will be explained below with reference to the accompanying drawings.

(1) First Embodiment

Figure 1:
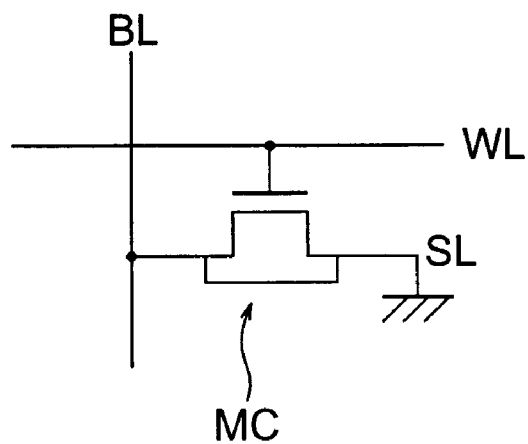
FIG. 1 is an equivalent circuit diagram of a memory cell in a semiconductor memory according to the first embodiment of the present invention.
Figure 2:
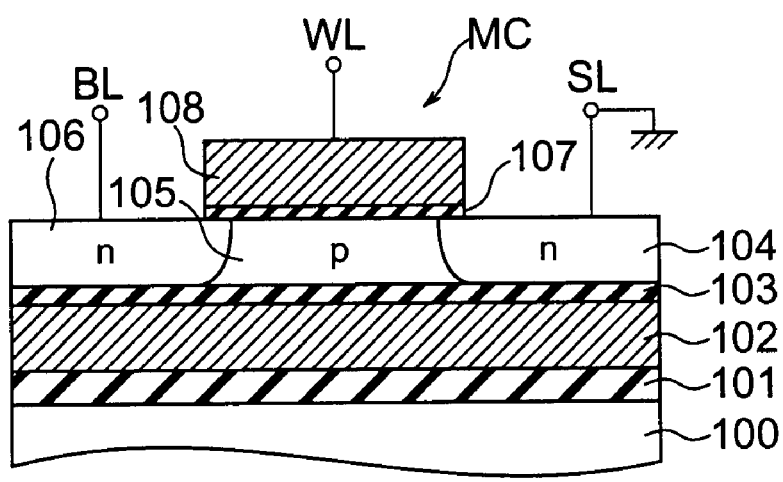
FIG. 2 is a longitudinal sectional view showing the basic structure of the memory cell.

First, an outline of the structure of a memory cell in a semiconductor memory according to the first embodiment will be explained below. FIG. 1 shows an equivalent circuit of a memory cell MC. FIG. 2 shows the longitudinal sectional structure of an n-MOSFET forming the memory cell MC.

This nMOSFET uses an SOI substrate in which a silicon oxide film 101 is formed on a semiconductor substrate 100, a plate line 102 and gate insulating film 103 are formed on the silicon oxide film 101, and a p-type silicon layer 105 is formed on the gate insulating film 103.

A gate electrode 108 is formed on the silicon layer 105 via a gate insulating film 107. In the p-type silicon layer 105, an n-type drain diffusion layer 106 and n-type source diffusion layer 104 are formed in self-alignment with the gate electrode 108.

The gate electrode 108 is connected to a word line WL and driven to select a memory cell in a read or write operation. The drain diffusion layer 106 is connected to a bit line BL. In a read or write operation, a bias voltage is applied to the drain diffusion layer 106 to input or output data. The source diffusion layer 104 is connected to a source line SL and a ground terminal VSS. On the silicon oxide film 101 of this SOI substrate, the plate line 102 opposes the p-type silicon layer 105 in a body region in a floating state.

Figure 3:
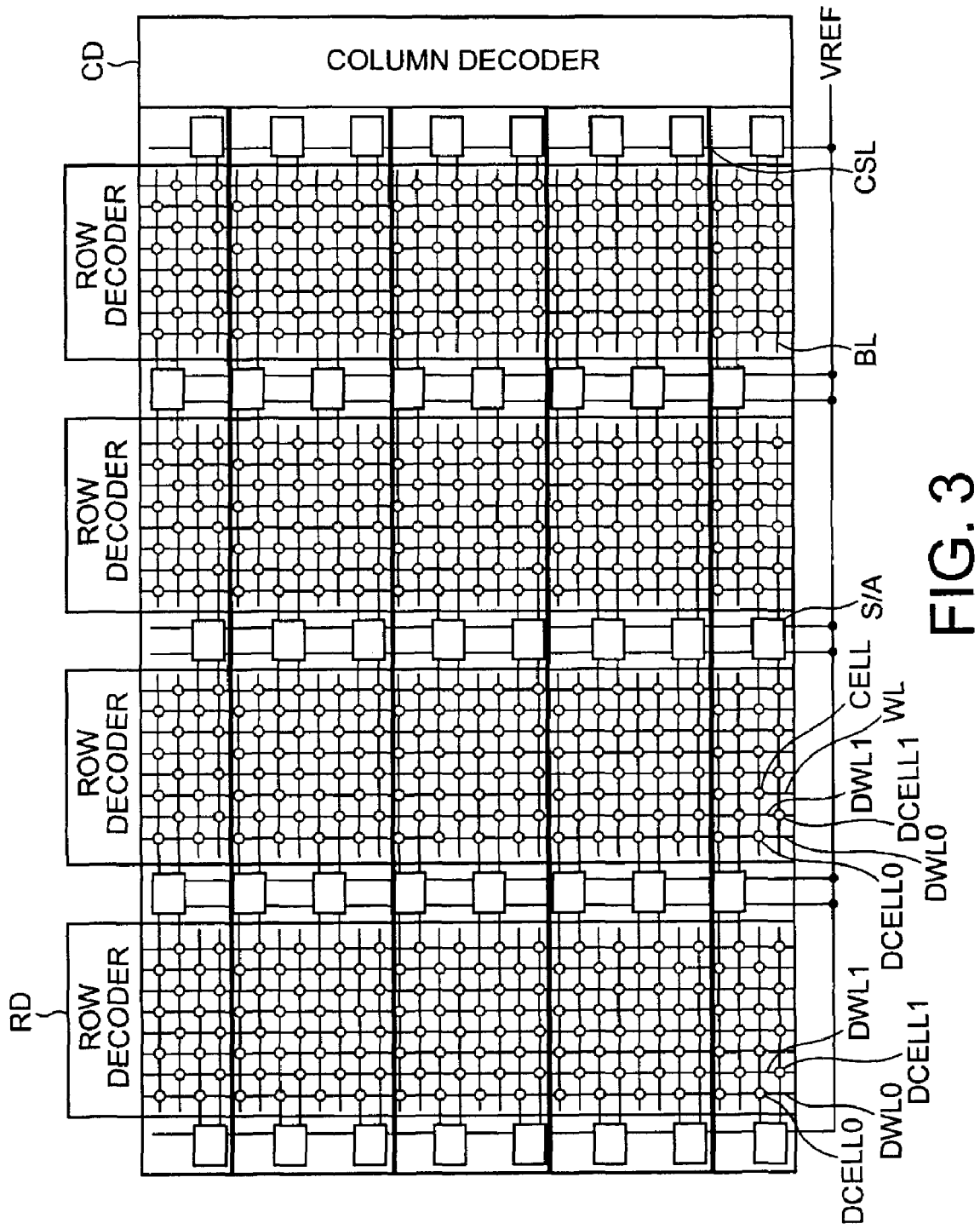
FIG. 3 is a circuit diagram showing the arrangement of a cell array when the semiconductor memory has dummy cells.

FIG. 3 shows the arrangement of a cell array in the semiconductor memory.

This cell array is formed by arranging, in the form of a matrix, a plurality of memory cells (FBCs) CELL at the intersections of a plurality of word lines WL running in the row direction and a plurality of bit lines BL running in the column direction.

In each of blocks arranged along the row direction, dummy cells DCELL0 in which data "0" is prewritten are arranged in a line along the row direction, and dummy cells DCELL1 in which data "1" is prewritten are arranged in an adjacent line. Dummy word lines DWL0 are connected to the dummy cells DCELL0 in which data "0" is written, and dummy word lines DWL1 are connected to the dummy cells DCELL1 in which data "1" is written. The dummy cells DCELL1 and DCELL0 each generate a reference current when reading out data from the memory cell CELL.

Corresponding word lines WL are connected to other memory cells CELL along the row direction. The dummy cells DCELL0 and DCELL1 and memory cells CELL are equal in size, structure, and electrical characteristics.

Assume that the state in which the body region contains many holes corresponds to data "1", and the state in which the body region contains a few holes corresponds to data "0". Assume also that the memory cells and dummy cells each have a grounded source, a drain connected to the bit line BL, and a gate connected to one of the word line WL and dummy word lines DWL0 and DWL1, and that the body region is electrically floating.

In the upper end of the cell array shown in FIG. 3, a row decoder RD for selecting the word line WL or dummy word line DWL0 or DWL1 is formed for each block. Similarly, in the right end of FIG. 3, a plurality of column decoders CD for selecting the bit lines BL are arranged. Note that a plurality of column select lines CSL are connected to the column decoders CD.

In the row direction, a plurality of sense amplifiers S/A are arranged along the word lines. A pair of bit lines BL are connected to each sense amplifier S/A as it is shared by the right and left cell arrays. The sense amplifier S/A reads out data written in a memory cell via the bit line BL.

Figure 4:
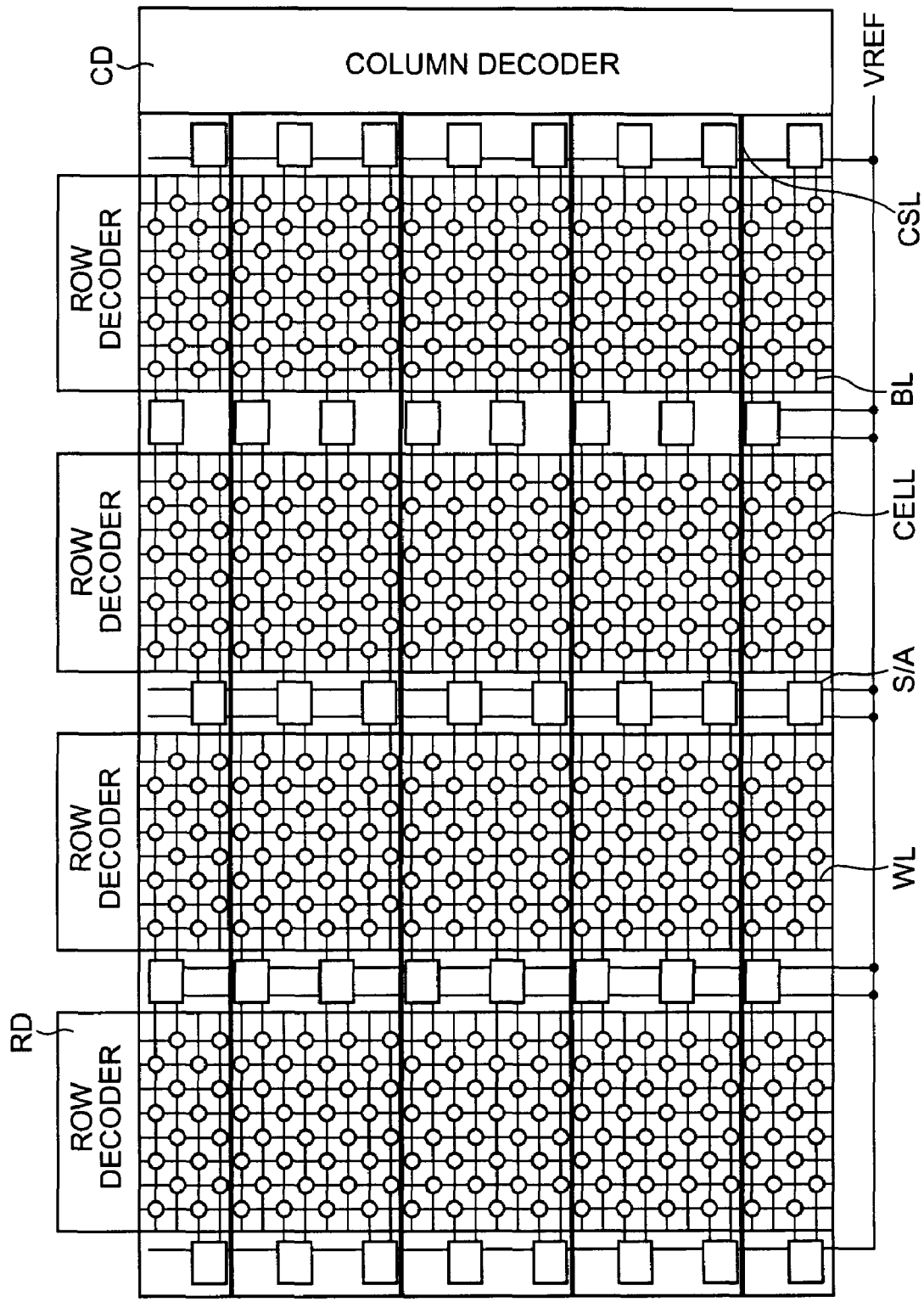
FIG. 4 is a circuit diagram showing the arrangement of a cell array when the semiconductor memory uses no dummy cells.

The cell array can also be formed without using any dummy cells. FIG. 4 shows this arrangement.

There is no dummy cell, and only a plurality of memory cells CELL are arranged. A reference voltage VREF is input to all sense amplifiers S/A from outside the cell array. The reference voltage VREF is generated inside the semiconductor memory, or input from outside the memory. The same reference numerals as in FIG. 3 denote the same components, and an explanation thereof will be omitted.

The reference voltage VREF in this case corresponds to a drain voltage Vd to be applied to each memory cell CELL via the bit line BL, and hence must satisfy equation (3) (to be described later).

When the dummy cells are used as shown in FIG. 3, even if the characteristics of the memory cells deviate from the design values owing to, e.g., the fluctuations in fabrication process, the dummy cells similarly deviate to remedy the memory cells. However, the operating speed is low. On the other hand, when no dummy cells are used as shown in FIG. 4, the fluctuations in characteristics are difficult to remedy because the reference voltage VREF uniquely determines the characteristics, but the operating speed is high.

The operation of the FBC memory according to the first embodiment will be explained below.

1) Write of Data "1"

The drain voltage Vd is set at 2 V, and a gate voltage Vg is set at 1.5 V. The n-type MOSFET of the memory cell is operated in a saturation region. Consequently, the impact ionization phenomenon occurs at the end portion of the drain diffusion layer 14 of the MOSFET, and generates hot carriers. A body region (the p-type semiconductor layer 12) stores the generated holes. When the body region thus stores the holes, the body effect makes a threshold voltage Vth1 of the MOSFET lower than that before the hole storage.

2) Write of Data "0"

The drain voltage Vd is set at −1.5 V, and the gate voltage Vg is set at 1.5 V. The p-n junction at the drain end of the memory cell is biased in the forward direction. This draws the holes stored in the body region to the drain diffusion layer 14. As a consequence, the potential of the body region deepens to make a threshold voltage Vth0 higher than the threshold voltage Vth1.

3) Data Read

Conventionally, as described previously, the memory cell is operated in the linear region by setting the drain voltage Vd at 0.2 V and the gate voltage Vg at 1.5 V, thereby reading out the potential difference in the body region as the difference between the threshold voltages Vth1 and Vth0. Accordingly, the drain current Id is dependent on the drain voltage Vd and largely affected by the parasitic resistance of the MOSFET. Since this superposes the variation in parasitic resistance on the variation in drain current Id, an operation error occurs in data read and decreases the yield.

As described above, the conventional method suppresses deterioration of the holding characteristic of data "0" by operating the memory cell in the linear region. However, the present inventors have achieved the present invention by noting that the linear region operation need not be performed because even the FBC memory requires a restore operation in order to prevent the charge pumping phenomenon.

The first embodiment, therefore, operates the memory cell in the saturation region during data read, and is characterized by the biasing conditions for data read. The biasing conditions are set to satisfy $$Vd > Vg - Vth0 \quad (3)$$

For example, when the threshold voltage Vth1 is about 0.7 V and the threshold voltage Vth0 is about 1.0 V, data is read out from the memory cell by setting the drain voltage Vd at 1.0 V and the gate voltage Vg at 1.5 V.

This allows the MOSFET as the memory cell to operate in the saturation region where the variation in drain current Id is small, and makes it possible to accurately read out the signal difference in the body region. After being read out, the data is restored.

Figure 5:
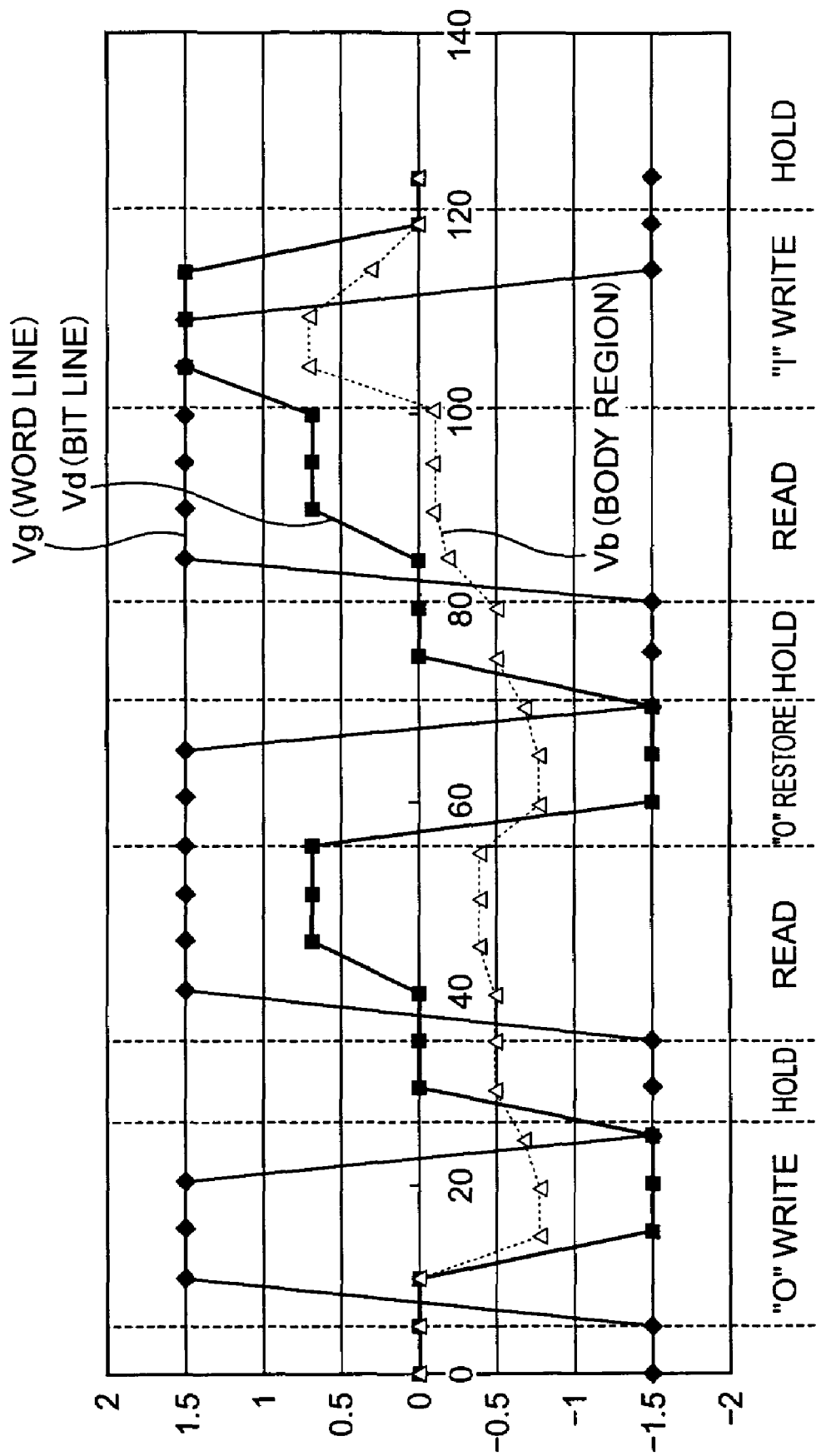
FIG. 5 is a timing chart showing the changes in gate voltage, drain voltage, and body region voltage in the semiconductor memory.

FIG. 5 shows the changes in gate voltage Vg of the word line WL, drain voltage Vd of the bit line BL, and voltage Vb of the body region 12, in each of data "0" write, data holding, data read, restoration of the readout data "0", data holding, data read, data "1" write, and data holding, in the first embodiment.

As described above, in data read the drain voltage Vd of the bit line BL is set at 0.7 V (the gate voltage Vg is 1.5 V) so as to satisfy equation (3).

Figure 6:
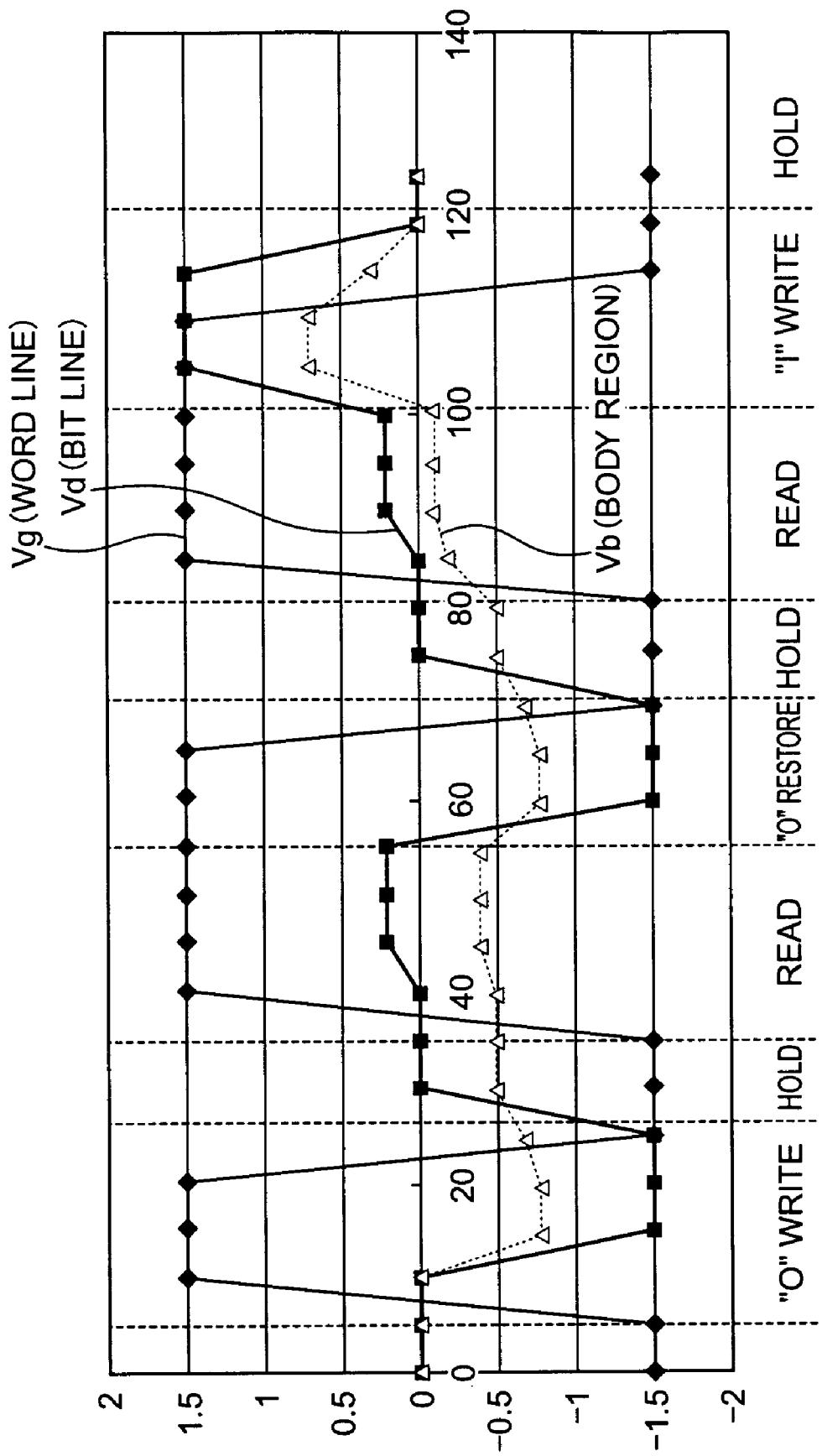
FIG. 6 is a timing chart showing the changes in gate voltage, drain voltage, and body region voltage in a semiconductor memory as a reference example.

FIG. 6 shows the changes in individual voltages in a reference example in which in data read the memory cell is operated in the linear region. In this case, the drain voltage Vd of the bit line BL in data read is set at 0.2 V. The biasing conditions in other operations (write, hold, and restore) are the same as in the first embodiment shown in FIG. 5.

The concept of the restore operation will be described below. Note that a write operation performed for each predetermined time will be called refresh, and a write operation performed immediately after data read will be called restore, thereby distinguishing between them.

Although memories are classified in accordance with, e.g., the data holding mechanism and memory cell structure, they can also be classified into memories that destroy held data when the data is read out, and nondestructive memories. For example, a DRAM (Dynamic Random Access Memory) is a memory that destroys held data, and a NAND flash memory is a nondestructive memory.

The DRAM will be explained below. The bit line BL of the memory cell is set at a voltage Vbleq as a voltage for holding data.

To equalize the bit lines BL, the voltage Vbleq is in many cases ½ a High-level voltage Vblh of the bit line BL during data write.

The potential of a storage node SN storing data is Vblh or 0.

In data read, the word line WL of the memory cell rises to a voltage Vpp to turn on the memory cell and set it at the same potential as the storage node.

If the High-level potential Vblh is written in the storage node, the difference between the read potential and bit line voltage Vbleq is a signal voltage Vsignal represented by $$V\text{signal} = \frac{1}{2} * Cs/(Cbl+Cs) * Vblh \quad (4)$$

where Cs is the capacitance of the storage node, and Cbl is the bit line capacitance.

Since the potentials of the storage node SN and bit line BL are the same, the potential of the storage node SN is ½*Vblh+Vsignal.

Note that this similarly applies to the case that data "0" is written in the storage node SN, but the signal voltage Vsignal as the difference between the read potential and bit line potential Vbleq is given by $$V\text{signal} = -\frac{1}{2} * Cbl/(Cbl+Cs) * Vblh \quad (5)$$

As described above, readout data has changed from that before the read, i.e., the data is destroyed, so it is necessary to rewrite correct data before the word line WL is selected next. This rewrite operation is called "restore".

The FBC is conventionally regarded as a nondestructive memory in which holes in the body region do not disappear unless they are erased.

It is, however, confirmed that holes in the body region are lost by the charge pumping phenomenon as described previously. Accordingly, data must be restored after being read out.

In the first embodiment, therefore, data is read out under the biasing conditions that the drain voltage Vd of the bit line BL satisfies equation (3). This improves the read margin while the data is destroyed. In addition, the data is rewritten by restoration after being read out.

The reason why equation (3) improves the operation margin will be described below.

Figure 7:
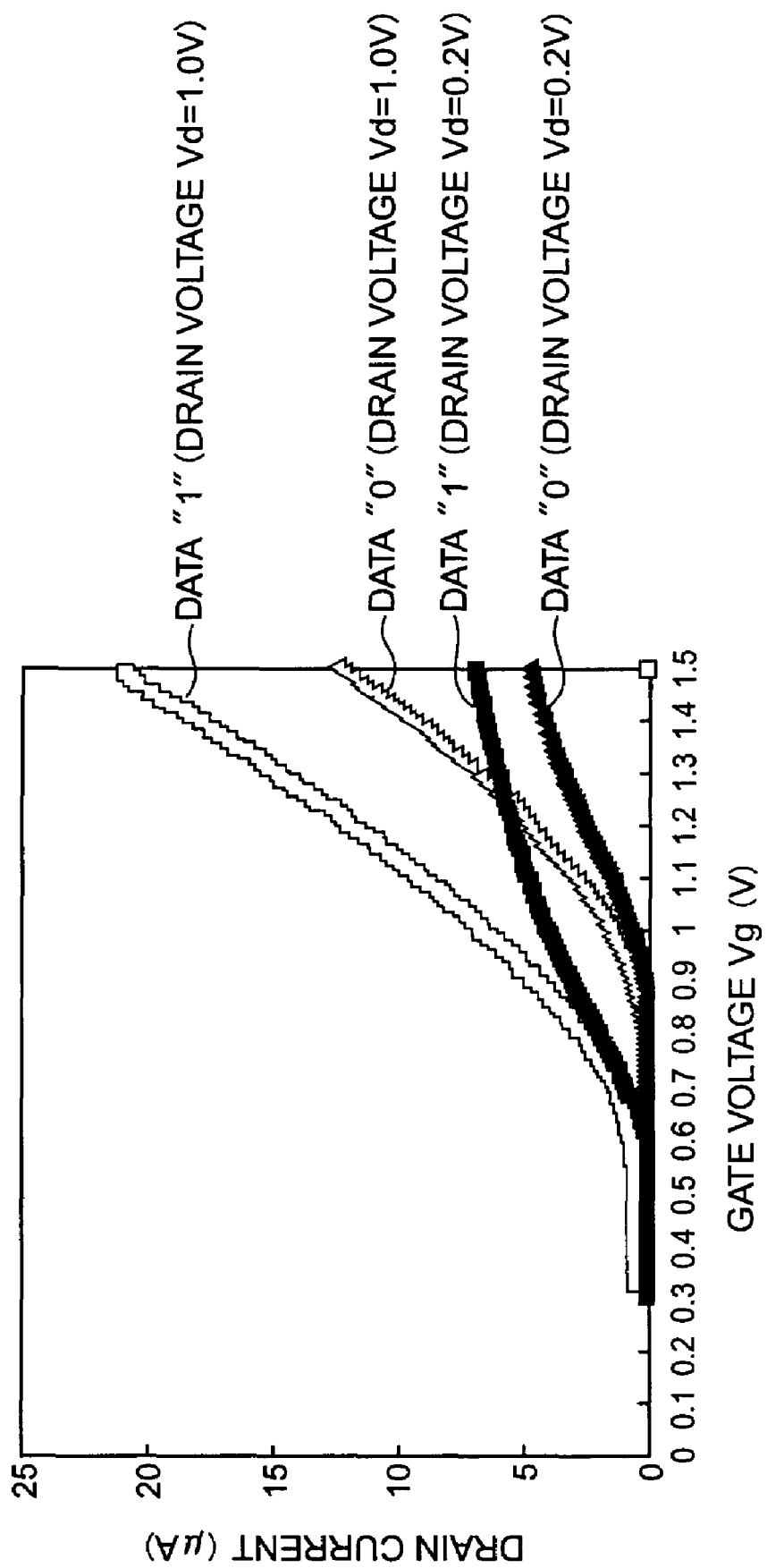
FIG. 7 is a graph comparing the characteristics of a drain current as a function of a gate voltage in the semiconductor memory according to the reference example with those of a drain current as a function of a gate voltage in the semiconductor memory according to the first embodiment.

FIG. 7 compares the characteristics of the drain current as a function of the gate voltage in one semiconductor memory according to the reference example with those of the drain current as a function of the gate voltage in one semiconductor memory according to the first embodiment.

In the semiconductor memory according to the reference example, as described previously, in data read the memory cell is operated in the linear region. FIG. 7 shows the drain current of a memory cell in which data "0" is written and that of a memory cell in which data "1" is written, when the drain voltage Vd is set at 0.2 V and the gate voltage Vg is changed as plotted on the abscissa.

By contrast, the first embodiment operates the memory cell in the saturation region during data read. FIG. 7 shows the drain current of a memory cell in which data "0" is written and that of a memory cell in which data "1" is written, when the drain voltage Vd is set at 1.0 V and the gate voltage Vg is changed.

As is apparent from this graph, the drain current characteristic as a function of the gate voltage Vg in the reference example in which the drain voltage Vd is 0.2 V differs from that in the first embodiment in which the drain voltage Vd is 1.0 V as follows:

1) In the first embodiment in which the drain voltage Vd is 1.0 V, a large drain current is obtained in the memory cell regardless of whether data "0" or "1" is written, when compared to the reference example.

2) In at least the range within which the gate voltage Vg is 0.7 to 1.1 V, the difference between the drain current of the memory cell in which data "0" is written and that of the memory cell in which data "1" is written is larger in the first embodiment than in the reference example, so the read error is smaller in the first embodiment than in the reference example.

FIG. 7 shows that even when the gate voltage Vg is 1.1 V or more, the drain current difference produced by data is larger and the read error is smaller in the first embodiment than in the reference example. This will be further verified by the following measurement results.

Figure 8:
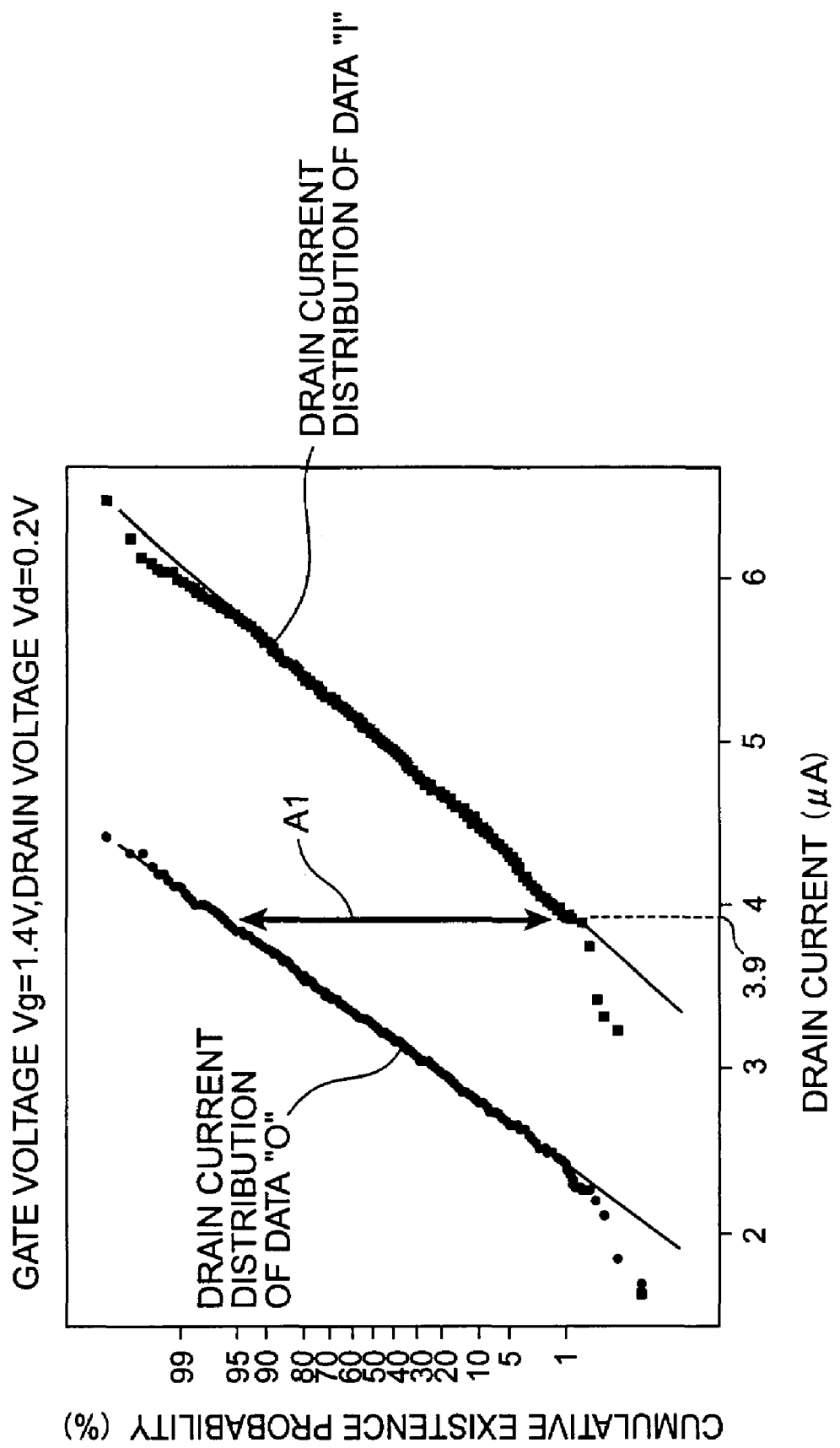
FIG. 8 is a graph showing the cumulative existence probability distributions of drain currents, when the gate voltage is 1.4 V, of memory cells in which data "0" is written and memory cells in which data "1" is written, in the semiconductor memory according to the reference example.

FIG. 8 shows the drain current distributions, when the gate voltage is 1.4 V, of memory cells in which data "0" is written and memory cells in which data "1" is written, in 1,000 semiconductor memories according to the reference example.

The larger the distance along the abscissa between the drain current distribution of 1,000 memory cells in which data "0" is written and that of 1,000 memory cells in which data "1" is written, the larger the sense margin and the smaller the read error.

A comparison of the drain current distributions, however, when the reference current in the sense amplifier S/A indicated by an arrow A1 in FIG. 8 is 3.9 µA demonstrates that memory cells in which data "0" is written and memory cells in which data "1" is written coexist.

That is, memory cells where the drain current is 3.9 µA include both memory cells in which data "1" is written, that are about 1% of the 1,000 memory cells, and memory cells in which data "0" is written, that are about 5 (=100−95)% of the 1,000 memory cells.

The read percent defective at which a data read error occurs is 3 (=(1+5)/2)% when it is defined as the average value of the sum of possibilities of read.

In a 1-Gbit semiconductor memory, for example, the number of defective bits is 30 M (=1 G×0.03), so the remedy is unsatisfactory even if a redundancy circuit is used.

Accordingly, the sense margin is low and an operation error occurs in the reference example.

Figure 9:
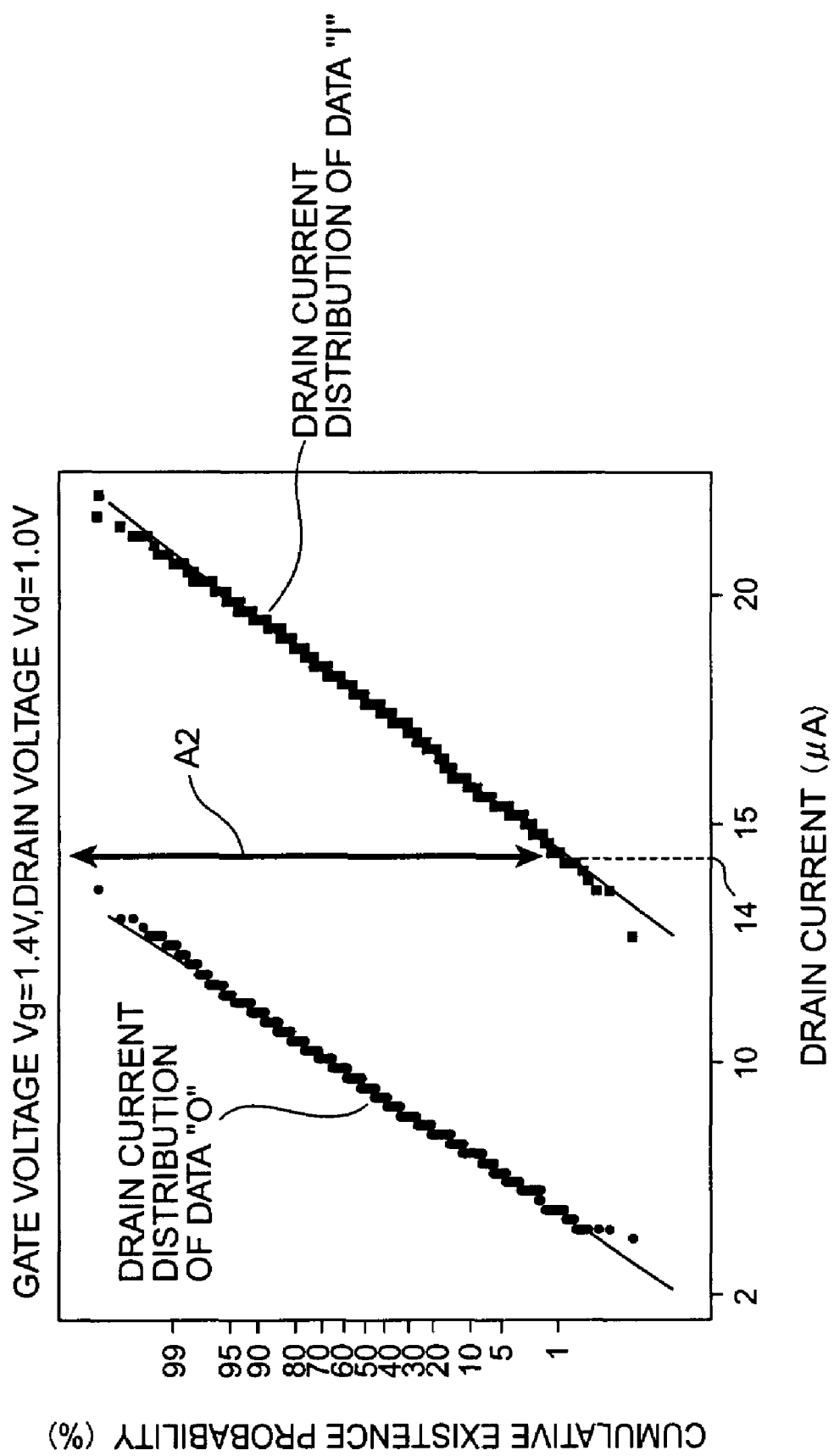
FIG. 9 is a graph showing the cumulative existence probability distributions of drain currents, when the gate voltage is 1.4 V, of memory cells in which data "0" is written and memory cells in which data "1" is written, in the semiconductor memory according to the first embodiment.

On the other hand, FIG. 9 shows the drain current distributions, when the gate voltage is ¼ V, of memory cells in which data "0" is written and memory cells in which data "1" is written, in 1,000 semiconductor memories according to the first embodiment.

A comparison of FIG. 9 with FIG. 8 reveals that the drain current distribution of 1,000 memory cells in which data "0" is written departs, along the abscissa, from that of 1,000 memory cells in which data "1" is written.

More specifically, if the reference current in the sense amplifier S/A is drain current=14 µA, a drain current of 14 µA or more can be obtained from only memory cells in which data "1" is written, and the probability that this drain current is obtained from memory cells in which data "0" is written is unlimitedly close to zero.

The ratio of memory cells in which data "1" is written and which generates a drain current of 14 µA or less is about 1%.

The read percent defective in the first embodiment is 0.5 (=(1+0)/2)% when it is defined as the average value of the sum of possibilities of read.

In a 1-Gbit semiconductor memory, the number of defective bits is 5 M (=1 G×0.005). Since the percent defective is reduced to ⅙ that of the reference example, remedy by a redundancy circuit is presumably possible.

From the foregoing, the first embodiment can reduce the variation in drain current Id during data read, thereby preventing operation errors and increasing the yield.

(2) Second Embodiment

A semiconductor memory according to the second embodiment of the present invention will be explained below.

The second embodiment operates a memory cell in a saturation region by satisfying equation (3) in the first embodiment, and also reduces a drain current during data read by setting a gate voltage Vg within a predetermined range.

When one word line is turned on in data read, all memory cells connected to the word line are activated. The purpose of the second embodiment is to reduce the current consumption of the whole memory in this state.

The second embodiment, therefore, is characterized by performing a read operation under the biasing conditions that satisfy equation (3) presented earlier and equation (6) below:

$$Vth1 \leq Vg \leq Vth0 \quad (6)$$

The biasing conditions for other operations, i.e., write, hold, and restore are the same as in the first embodiment.

A read operation is performed under the biasing conditions that, e.g., drain voltage Vd=1.0 V and gate voltage Vg=0.8 V, so as to meet equations (3) and (6). In this case, threshold voltage Vth1=0.7 V, and threshold voltage Vth0=1.0 V.

This makes it possible to prevent operation errors and increase the yield as in the first embodiment, and reduce the current consumption as well.

The reason why the biasing conditions based on equations (3) and (6) reduce the drain current will be explained below.

Figure 10:
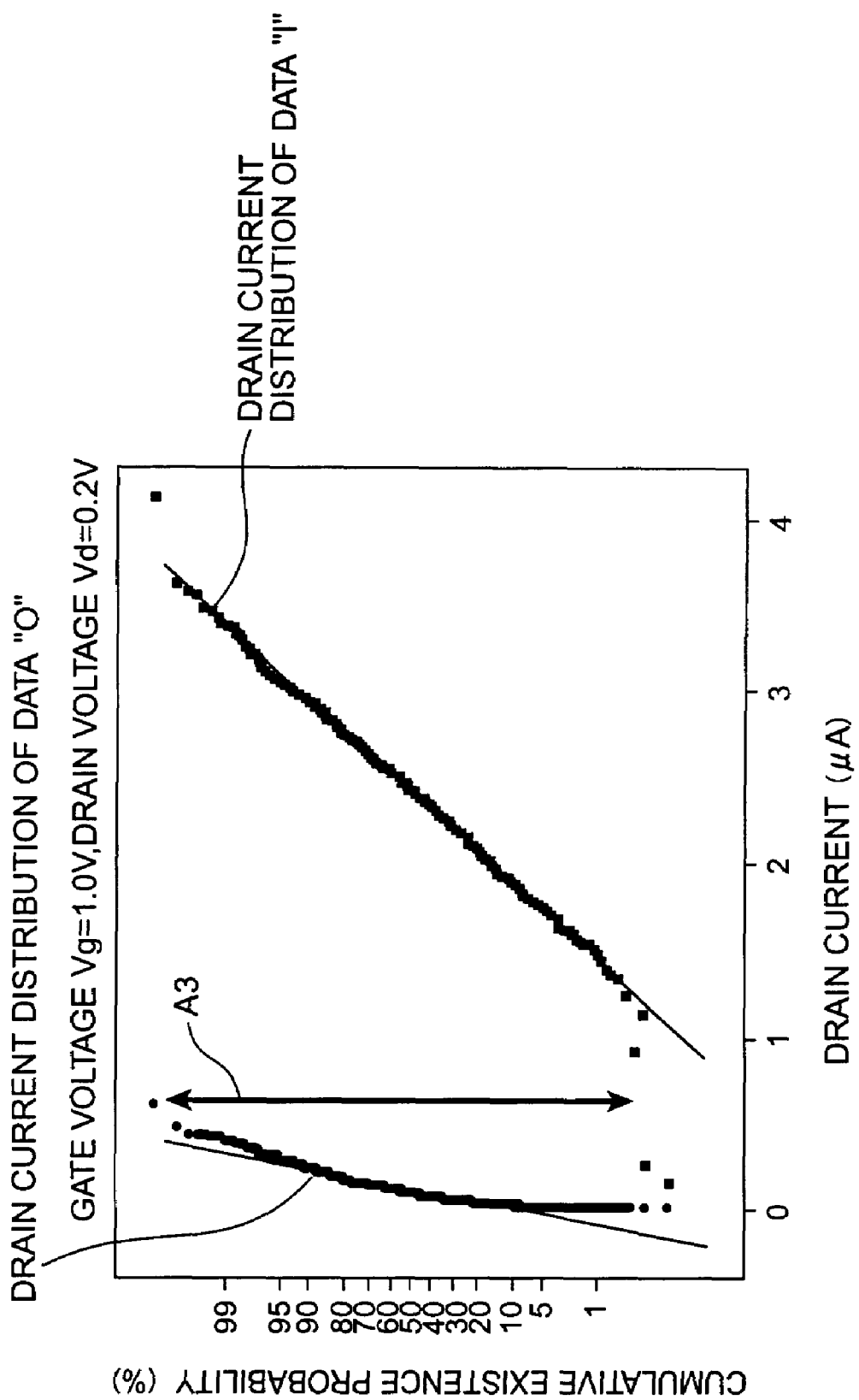
FIG. 10 is a graph showing the cumulative existence probability distributions of drain currents, when the gate voltage is 1.0 V, of memory cells in which data "0" is written and memory cells in which data "1" is written, in the semiconductor memory according to the reference example.

FIG. 10 shows the drain current distributions when data is read out, under the biasing conditions that the gate voltage is 1.0 V and the drain voltage Vd is 0.2 V, from memory cells in which data "0" is written and memory cells in which data "1" is written, in 1,000 semiconductor memories.

In this case, the memory cell operates in the saturation region in order to satisfy equation (3). When the reference current is set at 0.8 μA indicated by an arrow A3 in FIG. 10, the drain current distribution of memory cells in which data "0" is written does not overlap that of memory cells in which data "1" is written. This makes it possible to read out data "0" and "1" without any operation errors.

Also, when compared to the reference example shown in FIG. 8 in which the drain voltage Vd is 0.2 V, i.e., the same voltage as in this embodiment but the memory cell operates in the linear region without meeting equation (3), the value of the drain current plotted on the abscissa decreases. This indicates that the second embodiment reduces the current consumption in addition to preventing operation errors.

Figure 11:
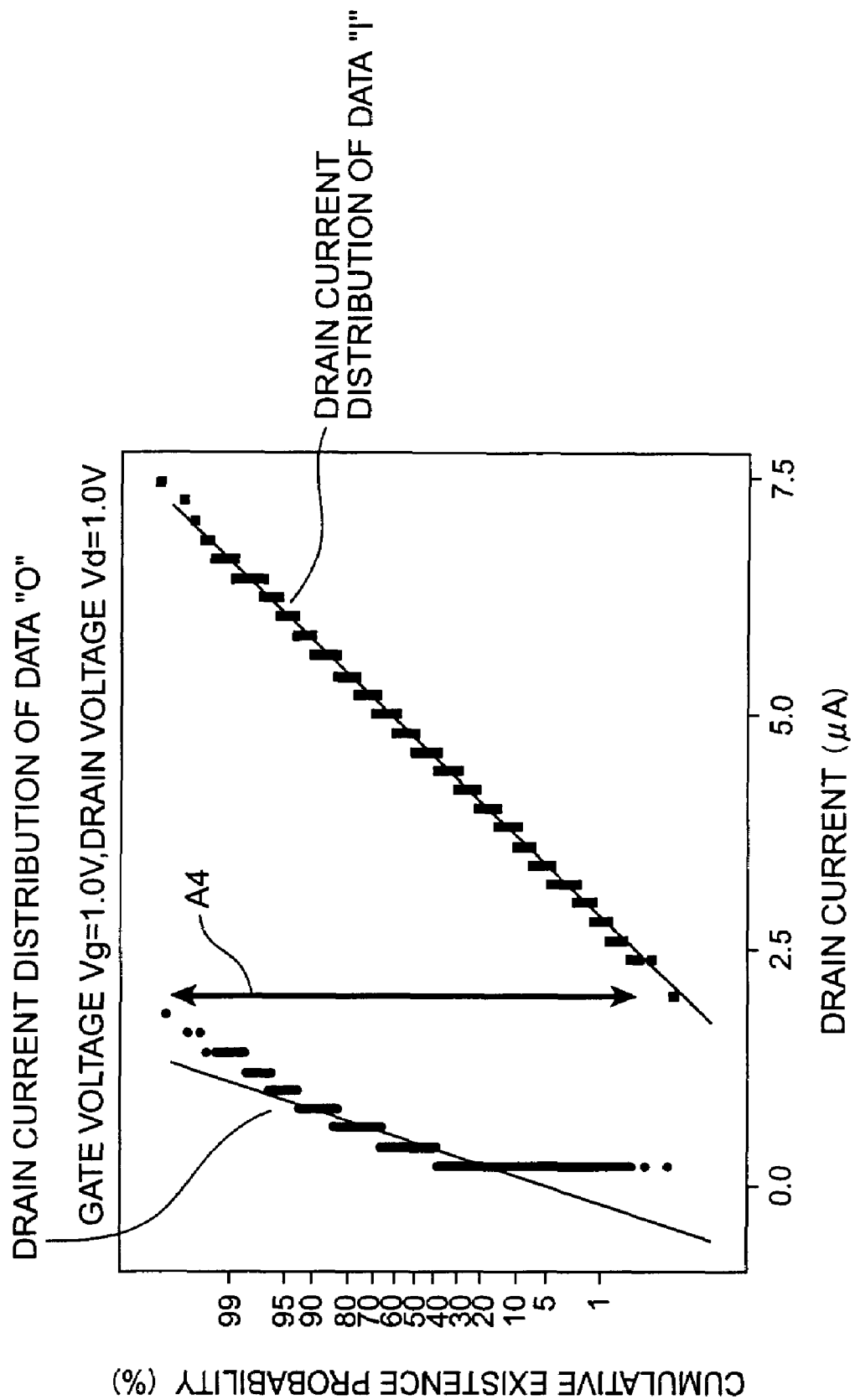
FIG. 11 is a graph showing the cumulative existence probability distributions of drain currents, when the gate voltage is 1.0 V, of memory cells in which data "0" is written and memory cells in which data "1" is written, in a semiconductor memory according to the second embodiment of the present invention.

FIG. 11 shows the drain current distributions when data is read out, under the biasing conditions that the gate voltage is 1.0 V and the drain voltage Vd is 1.0 V, from memory cells in which data "0" is written and memory cells in which data "1" is written, in 1,000 semiconductor memories.

In this case, as in the case shown in FIG. 10, the memory cell operates in the saturation region in order to satisfy equation (3). Also, when the reference current is set at 2.0 μA indicated by an arrow A4 in FIG. 11, the drain current distribution of memory cells in which data "0" is written hardly overlaps that of memory cells in which data "1" is written. Accordingly, data "0" and "1" can be read out without any operation errors.

Furthermore, a comparison with the first embodiment shown in FIG. 9 in which the drain voltage Vd is 1.0 V, i.e., the same as in this embodiment and the memory cell operates in the saturation region by meeting equation (3) but does not satisfy equation (6) will be explained. FIGS. 9 and 11 differ in drain current value plotted on the abscissa; the drain current reduces more in FIG. 11 corresponding to the second embodiment than in FIG. 9. Accordingly, the second embodiment can prevent operation errors and can also reduce the current consumption.

The semiconductor memories and their read methods according to the above embodiments can accurately detect a signal stored in the body region of the FBC, thereby preventing operation errors during a data read operation, and increasing the yield.

The first and second embodiments described above are merely examples and do not limit the present invention, so these embodiments can be variously modified within the technical scope of the present invention. The biasing conditions in the first and second embodiments are merely examples and need only satisfy equation (3) or equations (3) and (6).

What is claimed is:

1. A semiconductor memory comprising a memory cell which is a MOSFET formed on an SOI substrate and having a gate electrode connected to a word line, a drain region connected to a bit line, and a grounded source region, wherein an operation of reading out data written in said memory cell is performed under a biasing condition by which relationships Vd>Vg−Vth0 and Vth1 Vg≦Vth0 holds between a gate voltage Vg to be applied to said gate electrode, a drain voltage Vd to be applied to said drain region, a threshold voltage Vth1 of said MOSFET when a predetermined amount of holes are stored in a body region of said memory cell, and a threshold voltage Vth0 of said MOSFET when holes whose amount is smaller than the predetermined amount are stored in said body region.

2. The memory according to claim 1, wherein after data written in said memory cell is read out, restoration is performed to write the data in said memory cell.

3. The memory according to claim 1, wherein the operation of reading out data written in said memory cell is performed by operating said memory cell in a saturation region.

4. A semiconductor memory, comprising;

a cell array having a plurality of memory cells at intersections of a plurality of word lines provided in row direction and a plurality of bit lines provided in column direction;

a column decoder selecting the bit lines;

a row decoder selecting the word lines; and a sense amplifier connected to the bit lines and reading out data written in the memory cells, wherein each of said memory cells is MOSFET formed on an SOI substrate and having a gate electrode connected to one of said word lines, a drain region connected to one of said bit lines, and a grounded source region, wherein an operation of reading out data written in said memory cell is performed under a biasing condition by which a relationship Vd>Vg−Vth0 holds between a gate voltage Vg to be applied to said gate electrode, a drain voltage Vd to be applied to said drain region, a threshold voltage Vth1 of said MOSFET when a predetermined amount of holes are stored in a body region of said memory cell, and a threshold voltage Vth0 of said MOSFET when holes whose amount is smaller than the predetermined amount are stored in said body region.

5. The memory according to claim 4, wherein a plurality of column select lines are provided for every predetermined number of said column lines in the column direction and are connected to said column decoder.

6. The memory according to claim 4, wherein said sense amplifier is provided with a reference voltage.

7. The memory according to claim 6, wherein the reference voltage is applied to the drain region of said memory cells as the drain voltage Vd via the bit lines.

8. The memory according to claim 4, wherein said memory comprises a plurality of sense amplifiers connected to every pair of bit lines and reading out data written in the memory cells.

9. The memory according to claim 8, wherein all of said sense amplifiers are provided in common with a reference voltage.

10. The memory according to claim 9, wherein the reference voltage is applied to the drain region of said memory cells as the drain voltage Vd via the bit lines.

11. The memory according to claim 4, wherein the memory further comprises,
a plurality of dummy cells at intersections of a plurality of dummy word lines provided in the row direction and said bit lines.

12. The memory according to claim 4, wherein after data written in said memory cell is read out, restoration is performed to write the data in said memory cell.

13. The memory according to claim 4, wherein the operation of reading out data written in said memory cell is performed under a biasing condition by which the relationship $Vd > Vg - Vth0$ and a further relationship $Vth1 \leq Vg \leq Vth0$ hold.

14. A read method of a semiconductor memory comprising a memory cell which is a MOSFET formed on an SOI substrate and having a gate electrode connected to a word line, a drain region connected to a bit line, and a grounded source region,
wherein an operation of reading out data written in said memory cell is performed under a biasing condition by which relationships $Vd > Vg - Vth0$ and the $Vth1 \leq Vg \leq Vth0$ holds between a gate voltage Vg to be applied to said gate electrode, a drain voltage Vd to be applied to said drain region, a threshold voltage Vth1 of said MOSFET when a predetermined amount of holes are stored in a body region of said memory cell, and a threshold voltage Vth0 of said MOSFET when holes whose amount is smaller than the predetermined amount are stored in said body region.

15. The method according to claim 14, wherein after data written in said memory cell is read out, restoration is performed to write the data in said memory cell.

16. The method according to claim 14, wherein an operation of writing a first data in said memory cell is performed by operating said memory cell in a saturation region, storing generated holes in the body region to have a first threshold voltage, and an operation of writing a second data in said memory cell is performed by biasing said memory cell in a forward direction, drawing holes in the body region to have a second threshold voltage higher than the first threshold voltage.

17. The method according to claim 14, wherein the operation of reading out data written in said memory cell is performed by operating said memory cell in a saturation region.

\* \* \* \* \*